United States Patent
Law et al.

(10) Patent No.: US 8,487,444 B2
(45) Date of Patent: Jul. 16, 2013

(54) THREE-DIMENSIONAL SYSTEM-IN-PACKAGE ARCHITECTURE

(75) Inventors: Oscar M. K. Law, Hsin-Chu (TW); Kuo H. Wu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 136 days.

(21) Appl. No.: 12/631,346

(22) Filed: Dec. 4, 2009

(65) Prior Publication Data

US 2010/0225002 A1 Sep. 9, 2010

Related U.S. Application Data

(60) Provisional application No. 61/158,260, filed on Mar. 6, 2009.

(51) Int. Cl.
*H01L 23/48* (2006.01)

(52) U.S. Cl.
USPC ..... 257/774; 257/686; 257/777; 257/E23.011

(58) Field of Classification Search
USPC .................. 257/774, 777, 686, 621
See application file for complete search history.

(56) References Cited

U.S. PATENT DOCUMENTS

| | | |
|---|---|---|
| 5,391,917 A | 2/1995 | Gilmour et al. |
| 5,399,898 A * | 3/1995 | Rostoker ............... 257/499 |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,707,157 B2 | 3/2004 | Hoshino |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |

(Continued)

FOREIGN PATENT DOCUMENTS

| | | |
|---|---|---|
| JP | 2003-023067 A | 1/2003 |
| JP | 2003017558 A | 1/2003 |

(Continued)

OTHER PUBLICATIONS

Japanese Office Action regarding Japanese Patent Application No. 2010-049223, dated Oct. 30, 2012, 10 pages.

*Primary Examiner* — Thanh Nguyen
(74) *Attorney, Agent, or Firm* — Slater & Matsil, L.L.P.

(57) ABSTRACT

A system and method for making semiconductor die connections with through-silicon vias (TSVs) are disclosed. A semiconductor die is manufactured with both via-first TSVs as well as via-last TSVs in order to establish low resistance paths for die connections between adjacent dies as well as for providing a low resistance path for feedthrough channels between multiple dies.

13 Claims, 3 Drawing Sheets

U.S. PATENT DOCUMENTS

| | | | |
|---|---|---|---|
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,663,232 B2 * | 2/2010 | Kinsley | 257/726 |
| 7,939,941 B2 | 5/2011 | Chiou et al. | |
| 8,030,113 B2 * | 10/2011 | Hsu et al. | 438/55 |
| 8,049,296 B2 | 11/2011 | Miyakawa et al. | |
| 8,247,323 B2 * | 8/2012 | Kikuchi et al. | 257/774 |
| 2002/0109236 A1 * | 8/2002 | Kim et al. | 257/777 |
| 2003/0178389 A1 | 9/2003 | Yuasa | |
| 2009/0160050 A1 * | 6/2009 | Miyakawa et al. | 257/737 |

FOREIGN PATENT DOCUMENTS

| | | |
|---|---|---|
| JP | 2007059769 A | 3/2007 |
| JP | 2007250561 A | 9/2007 |
| TW | 200901343 A | 1/2009 |

* cited by examiner

THREE-DIMENSIONAL SYSTEM-IN-PACKAGE ARCHITECTURE

This application claims the benefit of U.S. Provisional Patent Application Ser. No. 61/158,260, filed on Mar. 6, 2009, and entitled "Three-Dimensional System-in-Package Architecture," which application is incorporated herein by reference.

TECHNICAL FIELD

The present invention relates generally to a system and method for connecting semiconductor devices and, more particularly, to a system and method for using via-first through-silicon vias (TSVs) and via-last TSVs to connect dies in a System in Package (SiP) configuration.

BACKGROUND

Generally, through-silicon vias (TSVs) have been used to form electrical connections within System-in-Package (SiP) architectures to connect multiple semiconductor dies through the semiconductor die substrates. One method of forming these TSVs is known as a via-first method, in which the TSV is formed through the substrate prior to the formation of the semiconductor die's metallization layers, and the TSV is electrically connected to a metallization layer close to the substrate. However, while maintaining a low resistance path for connections to the active devices located on the substrate, such a connection actually increases the resistance of any feedthrough connections (e.g., for supplying power to another die), which must also include the resistance of the metallization layers through which the electricity must pass to get to the other side of the die.

To reduce this feedthrough resistance, another approach known as a via-last method may be used. In this method the metallization layers are formed over the substrate first, and the TSV is formed to extend through both the substrate and the metallization layers. This approach allows for a straight path through the die without the added resistance from the metallization layers. However, while reducing the resistance from one side of the die to the other side (and to other dies), such a TSV also increases the resistance to the active devices on the die in which it is located, as any electrical signal would have to travel all the way through the semiconductor die along the via-last TSV and then, additionally, travel back through the metallization layers in order to reach the active devices.

Therefore, what is needed is a system that can reduce the feedthrough resistance without increasing the resistance for connections to the active devices.

SUMMARY OF THE INVENTION

These and other problems are generally solved or circumvented, and technical advantages are generally achieved, by embodiments of the present invention which provide for a hybrid structure of through-silicon vias (TSVs) in a System in Package (SiP) architecture.

In accordance with an embodiment of the present invention, a semiconductor device comprises a substrate with a first side and a second side opposite the first side and a first conductive region located over the first side of the substrate. A first conductive via extends from the second side of the substrate to the first conductive region without extending through the first conductive region, and a second conductive via extends from the second side of the substrate through the first conductive region.

In accordance with another embodiment of the present invention, a semiconductor device comprises a first semiconductor die comprising a first substrate and a first metallization region, the first substrate comprising a first side and a second side. A first conductive via extends from the second side of the first substrate to the first side of the first substrate and terminates at the first metallization region. A second conductive via extends through the first semiconductor die.

In accordance with yet another embodiment of the present invention, a method of manufacturing a semiconductor device comprises providing a first substrate and forming a first conductive via through the first substrate. A first conductive region is formed over the first substrate, and a second conductive via is formed through both the first substrate and the first conductive region.

An advantage of an embodiment of the present invention is that it provides a low resistive path for adjacent die connections through a via-first TSV while also providing a feedthrough channel for multiple die connections through a via-last TSV. By providing different TSVs depending upon the precise usage of the TSV, the overall resistance of the interconnects may be reduced.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments of the present invention in a specific context, namely a three dimensional System-in-Package (SiP) architecture with a hybrid structure of via-first through-silicon vias (TSVs) and via-last TSVs. The invention may also be applied, however, to other types of electrical connections.

Figure 1:
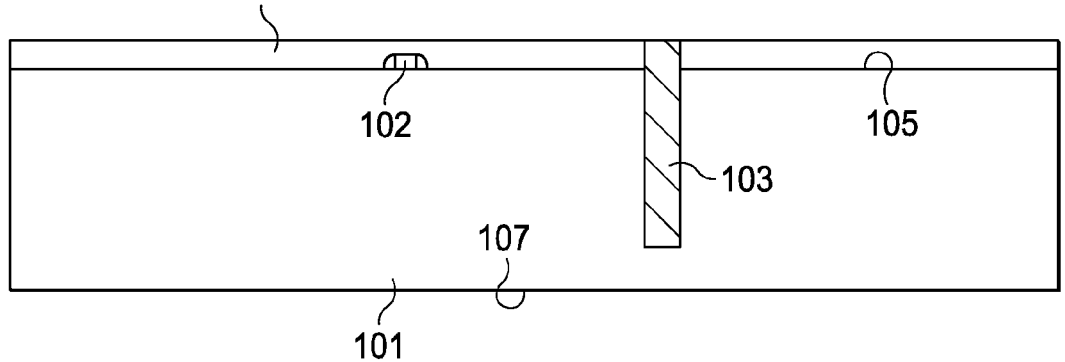
FIG. 1 illustrates the beginning steps in forming a via-first through-silicon via (TSV) in accordance with an embodiment of the present invention.

With reference now to FIG. 1, there is shown a substrate 101 with active devices 102 and an interlayer dielectric (ILD) 104, the substrate having a first side 105, a second side 107 opposite the first side 105, and a via-first TSV via 103 formed therein. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium-on-insulator (SGOI), or combinations thereof. Other substrates that may be used include multi-layered substrates, gradient substrates, or hybrid orientation substrates.

The active devices 102 are represented on FIG. 1 as two transistors. However, as one of skill in the art will recognize, a wide variety of active devices such as capacitors, resistors, inductors, high-k metal gate devices, and the like may be used to generate the desired structural and functional requirements of the design. The active devices 102 may be formed using any suitable methods either within or on the surface of the substrate 101.

The ILD 104 is formed over the substrate 101 and active devices 102 by chemical vapor deposition, sputtering, or any other method known and used in the art for forming an ILD 104. The ILD 104 typically may have a planarized surface and may be comprised of silicon oxide, although other materials, such as high-k materials, could alternatively be utilized. Optionally, the ILD 104 may be formed so as to impart a strain to the substrate 101 within the active devices 102, which will increase the overall performance of the active devices 102, as is known in the art.

The via-first TSV via 103 may be formed by initially applying and developing a suitable photoresist (not shown), and then etching the ILD 104 and substrate 101 to form an opening. The opening at this stage is formed so as to extend into the substrate 101 at least further than the active devices 102, and to a depth at least greater than the eventual desired thickness of the finished substrate 101. Accordingly, while the depth is dependent upon the overall design of the first substrate 101, the depth may be between about 1 µm and about 700 µm below the surface of the substrate 101, such as about 50 µm. The opening also may be formed to have a diameter of between about 1 µm and about 100 µm, such as about 6 µm.

Once the opening has been formed, the opening may be filled with a barrier layer and a conductive material to form the via-first TSV via 103. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer is formed so as to contour to the underlying shape of the opening for the via-first TSV via 103.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the opening for the via-first TSV via 103. Once the opening for the via-first TSV via 103 has been filled, excess barrier layer and excess conductive material outside of the opening for the via-first TSV via 103 is removed through a grinding process such as chemical mechanical polishing (CMP), although any suitable removal process may be used.

Figure 2:
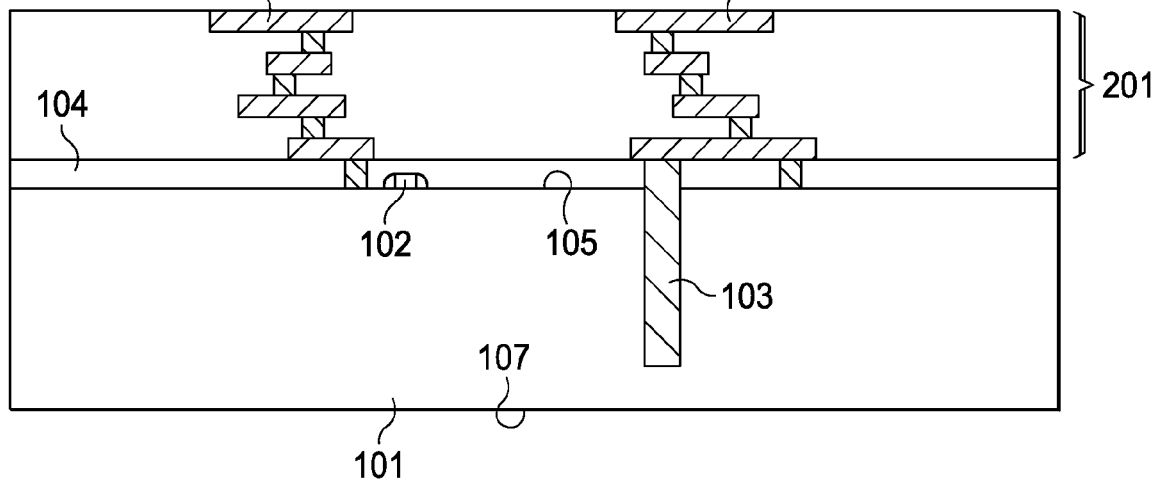
FIG. 2 illustrates a back end of line process in accordance with an embodiment of the present invention.

FIG. 2 illustrates the formation of metallization layers 201 over the ILD 104, the substrate 101, and the via-first TSV via 103. The metallization layers 201 are formed over the substrate 101, the active devices 102, the ILD 104, and the via-first TSV via 103, and are designed to connect the various active devices 102 to form functional circuitry. The metallization layers 201 are formed of alternating layers of dielectric and conductive material and may be formed through any suitable process (such as deposition, damascene, dual damascene, etc.). In an embodiment, there are at least four layers of metallization separated from the substrate 101 by the ILD 104, but the precise number of metallization layers 201 is dependent at least in part upon the overall design of the semiconductor die.

Contact pads 203 may be formed within the upper layer of the metallization layers 201 in order to provide a connection from the circuitry (including the active devices 102 and the metallization layers 201) to other devices (such as other semiconductor dies as described below with respect to FIG. 5). The contact pads 203 may comprise aluminum, and may be formed by conformally depositing a layer of aluminum so as to contact a connection from lower layers of the metallization layers 201. Once the layer of aluminum has been deposited, a photoresist may then be formed over the layer, and the layer of aluminum is then etched to form the contact pads 203.

Figure 3:
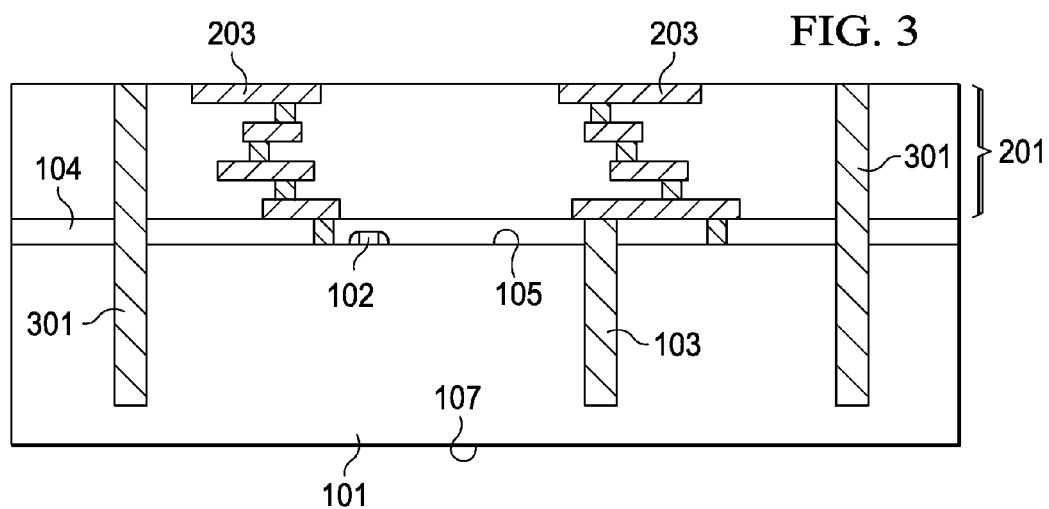
FIG. 3 illustrates the beginning steps in forming via-last TSVs in accordance with an embodiment of the present invention.

FIG. 3 illustrates the formation of via-last TSV vias 301. The via-last TSV vias 301 may be formed by applying and developing a suitable photoresist (not shown), and then etching the metallization layers 201, the ILD 104 and at least a portion of the substrate 101. The via-last TSV vias 301 are formed, similar to the via-first TSV via 103, so as to extend into the substrate 101 at least further than the active devices 102, and also to a depth greater than the eventual desired height of the substrate 101. Accordingly, while the depth of the via-last TSV vias 301 from the surface of the substrate 101 is dependent upon the overall design of the device, the depth may be between about 1 µm and about 700 µm, such as about 50 µm. Further, the via-last TSV vias 301 may have a diameter of between about 1 µm and about 100 µm, such as about 6 µm.

Optionally, via-last contact pads (not shown) may also be formed over the via-last TSV vias 301 in order to provide for an exterior connection to other devices. The via-last contact pads may formed in a similar manner and from similar materials as the contact pads 203 described above with respect to FIG. 2. However, any suitable material and method to form the via-last contact pads may alternatively be utilized.

Figure 4:
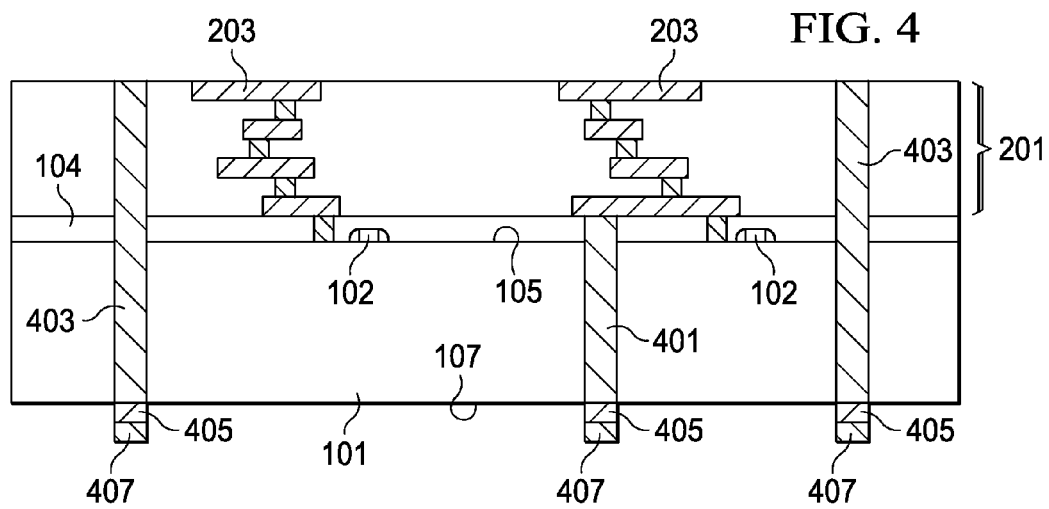
FIG. 4 illustrates a thinning of the wafer in accordance with an embodiment of the present invention.

FIG. 4 illustrates a thinning of the substrate 101 in order to expose the via-first TSV via 103 and the via-last TSV vias 301 to form a via-first TSV 401 and via-last TSVs 403. To thin the substrate 101, portions of the second side 107 of the substrate 101 are removed to expose the conductive material located within the via-first TSV via 103 and the via-last TSV vias 301. The removal may be performed with a grinding process such as a chemical mechanical polish (CMP), although other suitable processes, such as etching, may alternatively be used.

However, as one of ordinary skill in the art will recognize, the above described methods of forming the via-first TSV 401 and the via-last TSVs 403 are merely one illustrative embodiment, and are not intended to limit the present invention to just these methods. Other suitable methods may alternatively be utilized. For example, the openings for the via-first TSV via 103 and the via-last TSV via 301 may be filled with dielectric material until after the thinning of the second side 107 of the substrate 101, at which point the dielectric material may be removed and replaced with conductive material. This embodiment, and any other suitable embodiment, may alternatively be used to form the via-first TSV 401 and the via-last TSVs 403.

After the removal of a portion of the second side 107 of the substrate 101, a cleaning etch may be performed. This cleaning etch is intended to clean and polish the substrate 101 after the CMP. Additionally, this cleaning etch also helps release stresses that may have formed during the CMP process of grinding the substrate 101. The cleaning etch may use $HNO_3$, although other suitable etchants may alternatively be used.

Furthermore, after a cleaning process to remove any remaining polishing residue such as copper oxide, a conductive layer 405 may be formed on the second side 107 of the substrate 101 in electrical contact with the via-first TSV 401 and the via-last TSVs 403. The conductive layer 405 may comprise aluminum, and may be formed through a sputter deposition process. However, other materials, such as nickel or copper, and other formation processes, such as electroplating or electroless plating, may alternatively be used. The conductive layer 405 may be formed with a thickness of between about 1 µm and about 3 µm, such as about 2 µm.

The formation of the conductive layer 405 may be followed by an Electroless Nickel Gold (ENIG) process to form an ENIG layer 407 opposite the conductive layer 405 from the substrate 101. The ENIG process provides for a uniform metal surface finish for the formation of contacts from the substrate 101 to other devices (described below with respect to FIG. 5). The ENIG process may comprise cleaning the conductive layer 405, immersing the substrate 101 in a zincate activation solution, electrolessly plating nickel onto the conductive layer 405, and electrolessly plating gold onto the nickel. The ENIG layer 407 may be formed to a thickness of between about 2 µm and about 4 µm, such as about 3 µm. Once formed, the conductive layer 405 and the ENIG layer 407 are patterned by a suitable photolithographic process and unwanted material is removed through a suitable etching process as illustrated by FIG. 4.

It should be noted that the conductive layer 405 and ENIG layer 407 described above are merely one potential process that may be used along the thinned second side 107 of the substrate 101. Alternatively, the second side 107 of the substrate 101 may be recessed such that the via-first TSV 401 and the via-last TSVs 403 extend away from the surface of the second side 107 of the substrate 101. Additionally, a passivation layer may be formed in order to protect the via-first TSVs 401 or the via-last TSVs 403, or a redistribution layer or other types of suitable interconnects may alternatively be formed on the second side 107 of the substrate 101.

Figure 5:
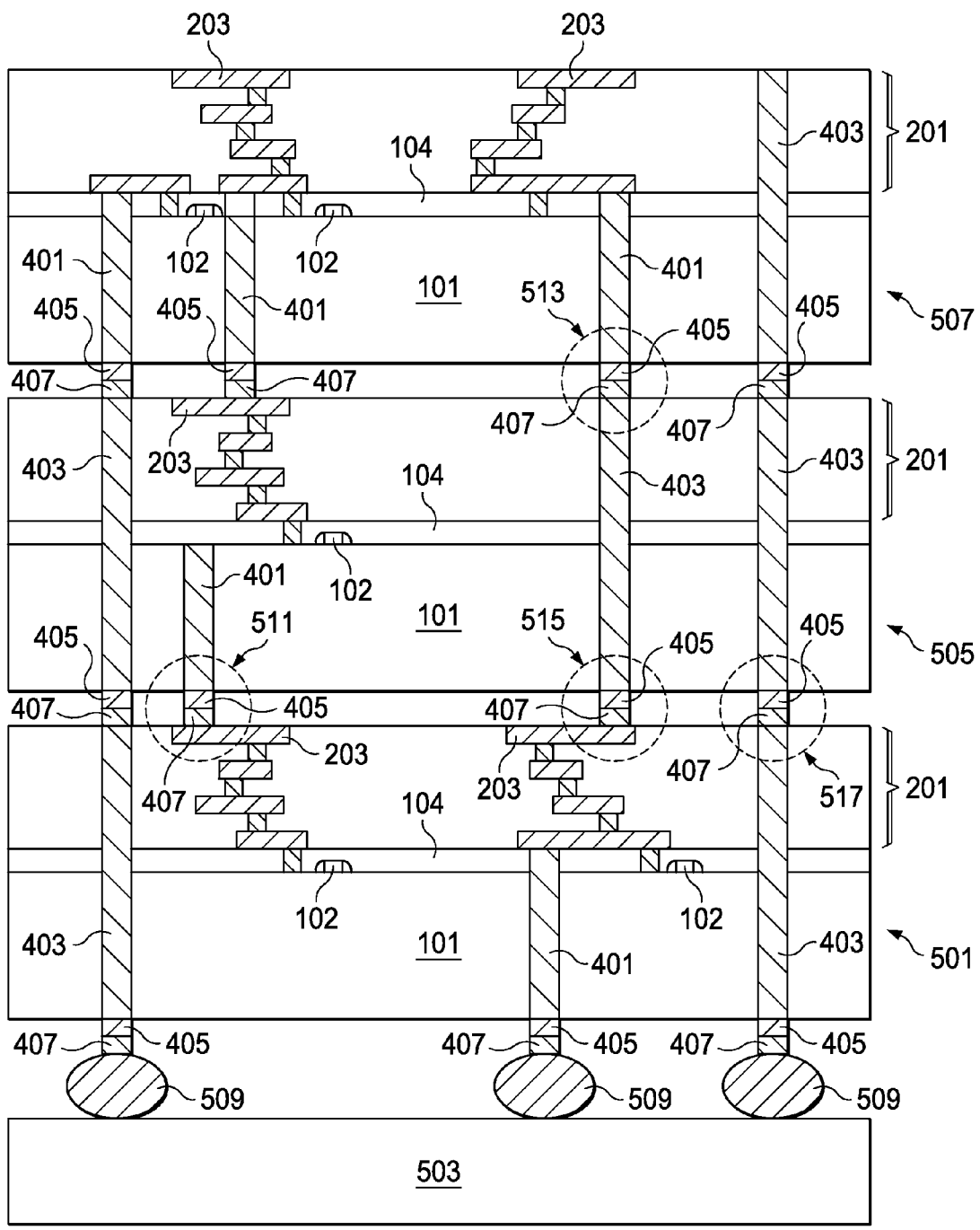
FIG. 5 illustrates connecting multiple dies with a hybrid structure of via-first and via-last TSVs in accordance with an embodiment of the present invention.

FIG. 5 illustrates an embodiment of the present invention in which a first die 501 formed using the process described above with respect to FIGS. 1-4 is integrated within a SiP architecture along with a packaging substrate 503, a second die 505, and a third die 507. The packaging substrate 503 provides I/O, power and ground connectivity to the via-first TSVs 401 and the via-last TSVs 403 through contact bumps 509. The packaging substrate 503 may be a printed circuit board (PCB), IC package, or any other substrate that may be mounted while also transmitting signals, power and ground to the first die 501, second die 505, and third die 507.

The contact bumps 509 may comprise a material such as tin, or other suitable materials, such as silver, lead-free tin, or copper. In an embodiment in which the contact bumps 509 are tin solder bumps, the contact bumps 509 may be formed by initially forming a layer of tin through such commonly used methods such as evaporation, electroplating, printing, solder transfer, ball placement, etc., to a thickness of about 100 µm. Once a layer of tin has been formed on the structure, a reflow may be performed in order to shape the material into the desired bump shapes.

The second die 505 and the third die 507 may also be formed similarly to the first die 501 as described above with reference to FIG. 1-4. For example, in this embodiment both the second die 505 and the third die 507 may comprise both via-first TSVs 401, via-last TSVs 403, and contact pads 203. Further, while the exact number, placement, and location of the via-first TSVs 401 and the via-last TSVs 403 will necessarily be dependent at least in part upon the overall design of the SiP, the via-first TSVs 401 are located so as to provide connectivity to either a contact pad 203 (as illustrated by the first circled area 511) or else a via-last TSV 403 (as illustrated by the second circled area 513) of an adjacent die. Additionally, the via-last TSVs 403 are located so as to provide connectivity to either a contact pad 203 (as illustrated by the third circled area 515) or else another via-last TSV 403 (as illustrated by the fourth circled area 517).

However, as one of ordinary skill in the art will recognize, there are many combinations that may be used to interconnect any number of suitable dies, and the above described embodiment is not intended to limit the present invention. Any suitable combination of dies (with any number of via-first TSVs 401 and via-last TSVs 403 supplying power and signal paths, including none), may be utilized while remaining within the scope of the present invention, and all of these combinations are fully intended to be included within the scope of the present invention. Additionally, redistribution layers or interposers (not shown) may be formed or placed to ensure the proper alignment of connections (e.g., conductive layer 405 and ENIG layer 407) between the first die 501, the second die 505, and the third die 507.

By using a combination of via-first TSVs 401 and via-last TSVs 403, the advantages of both via-first TSVs 401 and via-last TSVs 403 may be utilized to provide a low resistive path for adjacent die connections through a via-first TSV 401 while also providing a feedthrough channel for multiple die connections through a via-last TSV 403. By providing an appropriate TSV depending upon the precise usage of the TSV, the overall resistance of the interconnects may be reduced.

For example, the resistance of an interconnect path between the packaging substrate 503 to one of the active devices 102 within the third die 507 of an SiP such as the one illustrated in FIG. 5 containing both via-first TSVs 401 and via-last TSVs 403 may be calculated by Equation 1:

$$\text{Interconnect Resistance} = R' + (n-1)R'' \quad (1)$$

Where: n is the number of dies
R is the resistance of the metallization layers in each die
R' is the resistance of the via-first TSVs in each die
R" is the resistance of the via-last TSVs in each die In other words, the resistive path to one of the active devices 102 on the third die 507 would be the resistance of a via-first TSV 401 in the third die 507 along with the resistances of the two via-last TSVs 403 that extend through the first die 501 and the second die 505.

This provides for a more cost effective solution for 3D SiP architecture than the standard prior art architectures that provide for connections to one of the active devices 102 on the third die 507 through either via-first TSVs 401 or via-last TSVs 403 only. In the case of only via-first TSVs 401, to get to an active device 102 on the third die 507, the resistive path would comprise the resistances of the via-first TSV 401 of the first die 501, the metallization layer 201 of the first die 501, the via-first TSV 401 of the second die 505, the metallization layer 201 of the second die 505, and the via-first TSV 401 of the third die 507, as summarized in Equation 2:

$$\text{Via-First TSV Resistance} = (n-1)R + nR' \quad (2)$$

In the case of only via-last TSVs 403, the resistive path to get to one of the active devices 102 on the third die 507 would comprise the resistance through the via-last TSVs 403 of each of the first die 501, the second die 505, and the third die 507, along with the resistance of the metallization layer 201 of the third die 507, as summarized in Equation 3:

$$\text{Via-Last TSV Resistance} = (R + nR'' \qquad (3)$$

Although the present invention and its advantages have been described in detail, it should be understood that various changes, substitutions and alterations can be made herein without departing from the spirit and scope of the invention as defined by the appended claims. For example, different combinations of via-first TSVs and via-last TSVs may be used in order to connect separate dies together. As another example, any number of methods used to form the via-first TSVs and via-last TSVs may alternatively be utilized.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
  a first substrate of a semiconductor die;
  a first plurality of dielectric layers over a first side of the first substrate;
  a first via extending through the first substrate and one or more of the first plurality of dielectric layers, the first via terminating in contact with a metal line of the semiconductor die; and
  a second via extending through the first substrate and two or more of the first plurality of dielectric layers, the second via extending through more of the first plurality of dielectric layers than the first via and having a first end terminating at a first side of the semiconductor die and a second end terminating at a second side of the semiconductor die.

2. The semiconductor device of claim 1, wherein the first via extends through only one of the first plurality of dielectric layers.

3. The semiconductor device of claim 1, further comprising:
  an active device located on the first substrate; and
  a plurality of metallization layers over the active device, wherein a first metallization layer closest to the first substrate electrically connects the first via to the active device.

4. The semiconductor device of claim 3, further comprising a conductive layer on an opposite side of the first substrate than the active device, the conductive layer in electrical contact with the first via.

5. The semiconductor device of claim 1, wherein the second via extends through each of the first plurality of dielectric layers.

6. The semiconductor device of claim 1, further comprising:
  a second substrate;
  a second plurality of dielectric layers;
  a third via extending through the second substrate and one or more of the second plurality of dielectric layers; and
  a fourth via extending through the second substrate and two or more of the second plurality of dielectric layers, the fourth via extending through more of the second plurality of dielectric layers than the third via, wherein the fourth via is electrically connected to the second via.

7. The semiconductor device of claim 6, wherein the third via is electrically connected to the first via through metallization layers located within the first plurality of dielectric layers.

8. A semiconductor device comprising:
  a first semiconductor die comprising a first substrate;
  a first conductive via extending through the first semiconductor die but not extending beyond the semiconductor die; and
  a second conductive via extending partially through the first semiconductor die, the second conductive via extending through the first substrate and having a first end in physical contact with a conductive portion of a metallization layer of the semiconductor die, the metallization layer being electrically connected to both an active device of the first semiconductor die and a contact pad of the first semiconductor die, the contact pad being on a same side of the first semiconductor die as the active device.

9. The semiconductor device of claim 8, further comprising a plurality of dielectric layers over the first substrate, wherein the second conductive via extends through a single dielectric layer located adjacent to the first substrate.

10. The semiconductor device of claim 8, further comprising an active device on the first substrate, wherein the active device is electrically connected to the second conductive via through the metallization layer.

11. The semiconductor device of claim 10, wherein the first conductive via is surrounded by dielectric material through the semiconductor die.

12. The semiconductor device of claim 8, further comprising:
  a second semiconductor die comprising a second substrate;
  a third conductive via extending through the second semiconductor die, wherein the third conductive via is electrically connected to the second conductive via; and
  a fourth conductive via extending less than through the second semiconductor die, the fourth conductive via extending through the second substrate.

13. The semiconductor device of claim 12, wherein the third conductive via is electrically connected to the second conductive via through metallization layers located over the substrate in the first semiconductor die.

* * * * *